United States Patent

Leers et al.

[11] Patent Number: 5,962,954
[45] Date of Patent: Oct. 5, 1999

[54] PIEZO-ELECTRIC TRANSFORMER

[75] Inventors: Dieter Leers, Stolberg; Klaus Löhn, Simmerath-Lammersdorf, both of Germany

[73] Assignee: U.S. Philips Corporation, New York, N.Y.

[21] Appl. No.: 08/931,391

[22] Filed: Sep. 16, 1997

[30] Foreign Application Priority Data

Oct. 10, 1996 [EP] European Pat. Off. ............. 96202818

[51] Int. Cl.$^6$ ................................................. H01L 41/08
[52] U.S. Cl. ......................................... 310/359; 310/357
[58] Field of Search ..................................... 310/357, 359

[56] References Cited

U.S. PATENT DOCUMENTS

| | | | |
|---|---|---|---|
| 3,736,446 | 5/1973 | Berlincourt et al. | 310/359 |
| 5,365,141 | 11/1994 | Kawai et al. | 310/359 |
| 5,371,430 | 12/1994 | Sato et al. | 310/359 |
| 5,463,266 | 10/1995 | Fukuoka et al. | 310/359 |
| 5,504,384 | 4/1996 | Lee et al. | 310/359 |
| 5,701,049 | 12/1997 | Kanayama et al. | 310/359 |
| 5,751,092 | 5/1998 | Abe | 310/359 |
| 5,818,150 | 10/1998 | Yamamoto et al. | 310/359 |

FOREIGN PATENT DOCUMENTS

| | | | |
|---|---|---|---|
| 63-34329 | 8/1988 | Japan | H01L 41/08 |
| 06338642 | 12/1994 | Jordan | H01L 41/107 |

*Primary Examiner*—Thomas M. Dougherty
*Attorney, Agent, or Firm*—Bernard Franzblau

[57] ABSTRACT

A piezo-electric transformer comprising a piezo-electric body (PEB) including a driving region having input electrodes (1, 3) and at least one driven region having output electrodes (E11). These regions have opposite faces with at least one of the regions comprising a number of sections polarized in a direction perpendicular to the opposite faces and one pole of each section being connected to an opposite pole of another section by electrically conductive elements (2, 1', 2') in such a way that the sections form a series arrangement.

These sections are in a very simple way effectively arranged in series, thereby increasing the input impedance of the piezo-electric transformer. Because the sections are polarized in opposing directions the electrically conductive elements can be of a very simple construction which do not require external conduction wires.

17 Claims, 3 Drawing Sheets

PIEZO-ELECTRIC TRANSFORMER

BACKGROUND OF THE INVENTION

This invention relates to a piezo-electric transformer comprising a piezo-electric body comprising a driving region equipped with input electrode means and at least one driven region equipped with output electrode means, said regions having opposite faces, at least one of the regions comprising a number of sections, said sections being polarized in a direction perpendicular to the opposite faces and one pole of each section being connected to an opposite pole of another section by electrically conductive means in such a way that the sections form a series arrangement.

The invention also relates to a circuit arrangement for operating a discharge lamp comprising such a piezo-electric transformer and to a circuit arrangement for igniting a high pressure discharge lamp comprising such a piezo-electric transformer.

A piezo-electric transformer as mentioned in the opening paragraph is known from Japanese Patent Application 06338642 A and from Japanese Patent Application 06234329. In the piezo-electric transformer disclosed in Japanese Patent Application 06338642 A the driving section comprises a series arrangement of polarized sections coupled with the input electrode means resulting in a relatively low input capacitance and therefore a relatively high input impedance. In the piezo-electric transformer disclosed in Japanese Patent Application 06234329 such a series arrangement is comprised in the driven region and coupled with the output electrode means so that the output impedance of the piezo-electric transformer is relatively high. In both piezo-electric transformers all the sections are polarized in the same direction. The poles of the sections are equipped with segments formed by patches of a metallic layer deposited on the opposite faces and connected to each other by means of external wiring. An important advantage of a relatively high impedance of the driving region is that the piezo-electric transformer becomes more suitable for use with an input voltage having a relatively high amplitude when the output power is very low or zero. A disadvantage of the known piezo-electric transformer is that its construction is relatively complicated and therefore expensive because of the external conduction wires, each of which connects two segments situated on different opposite faces.

SUMMARY OF THE INVENTION

The invention aims to provide a piezo-electric transformer that is of a relatively simple and inexpensive construction and has a relatively high input or output impedance. The invention also aims to provide a circuit arrangement for operating a discharge lamp that is relatively compact and inexpensive.

A piezo-electric transformer as mentioned in the opening paragraph is therefore characterized in that part of said sections are polarized in a first direction and the remainder of said sections are polarized in a second direction opposite to said first direction.

Opposite poles of oppositely polarized sections in a piezo-electric transformer according to the invention are tangent to the same face. The electrically conductive means connecting these opposite poles do not have to extend from one opposite face to the other and can therefore be very simple. For this reason a piezo-electric transformer according to the invention is of a relatively simple and inexpensive construction.

In case the series arrangement of sections is in the diving region and the driven region is polarized in a direction parallel to the opposite faces, the piezo transformer is of the Rosen type and is very suitable for generating a relatively high output voltage.

In case the piezo-electric body is a rectangular parallelepiped, the piezoelectric transformer is of a relatively simple and therefore inexpensive construction.

The electrically conductive means preferably comprise a metallic coating. In that way they are realized in a relatively simple and dependable way.

In case the piezo-electric body comprises two driven regions, each equipped with output electrode means, the output voltage is DC-uncoupled from the input voltage. This feature can be an important advantage in some applications and increases the applicability of the piezo-electric transformer.

It has been found that a piezo-electric transformer according to the invention is very suitable for use in a circuit arrangement for operating a discharge lamp. More in particular this is true for a circuit arrangement for operating a low pressure mercury discharge lamp designed for use as a back light in a liquid crystal display. Such low pressure mercury discharge lamps usually have a relatively high ignition and operating voltage (because of the high length/diameter ratio of the lamp vessel). At the same time the application demands that the circuit arrangement must only obtain a relatively small volume and be realized with relatively inexpensive components. A circuit arrangement comprising a piezo-electric transformer can generate the relatively high ignition and/or operating voltage and at the same time meet the other requirements.

For similar reasons a piezo-electric transformer according to the invention is also very suitable for use in a circuit arrangement for igniting a high pressure discharge lamp.

BRIEF DESCRIPTION OF THE DRAWING

Embodiments of a piezo-electric transformer according to the invention and embodiments of a circuit arrangement for operating a discharge lamp according to the invention will be further explained with reference to a drawing.

In the drawing.

DESCRIPTION OF THE PREFERRED EMBODIMENTS

Figure 1:
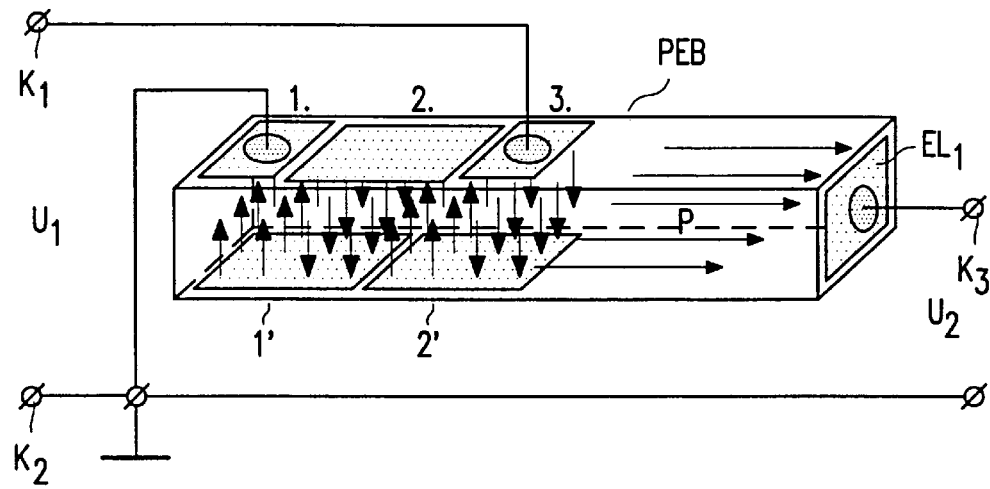
FIG. 1 shows a schematic representation of an embodiment of a piezo-electric transformer according to the invention.

In FIG. 1 K1 and K2 are terminals for connection to the poles of an input voltage source. PEB is a piezo-electric body in the shape of a rectangular parallelepiped. Opposite faces of the piezo-electric body PEB are covered with segments 1, 2, 3, 1' and 2' consisting of rectangular patches of a conductive coating. Terminal K1 is connected to segment 3. Terminal K2 is connected to segment 1. Segment 1 and segment 3 together form input electrode means. In the embodiment of FIG. 1 all the segments are formed as a metallic coating consisting of silver. The piezo-electric body PEB consists of a driving region being the part of the piezo-electric body that is situated between the segments 1, 2, 3, 1' and 2', and a driven region being the remaining part of the piezo-electric body. An end of the driven region remote from the driving region is equipped with an output electrode E11 connected to an output terminal K3. Output electrode E11 forms output electrode means. The driving region of the piezo-electric transformer is divided into 4 sections that are polarized in a direction perpendicular to the opposite faces. The driven region is polarized parallel to the opposite faces in a direction pointing from the driving region to the output electrode E11. Each of the 4 sections of the driving region is shaped as a rectangular parallelepiped. Neighbouring sections can be thought of as being bounded from each other by boundary planes that are perpendicular to the opposite faces and situated between neighbouring segments. At each boundary plane the direction of the polarization changes. Thus it can be seen that the first section of the driving region, being the section that is in contact with segment 1 is polarized in a first direction perpendicular to the opposite faces. Segment 1 is not in contact with other sections than the first section. The first section is in contact with segment 1 and segment 1'. The second section is in contact with segment 2 and segment 1'. It is situated between two boundary planes, the first of which is situated between segment 1 and segment 2 while the second is situated between segments 1' and 2'. The polarization of the second section is opposite to the polarization of the first section. The second boundary plane forms the boundary between the second and the third section. A third boundary plane that is situated between segment 2 and segment 3 forms the boundary between the third and the fourth section. The polarization of the third section is identical to the polarization of the first section. The third section is in contact with segment 2 and segment 2'. The polarization of the fourth section is identical to the polarization of the second section. Segment 3 is only in contact with the fourth section. The fourth section is in contact with segment 3 and segment 2'. Thus, the electrically conductive means connecting opposite poles of oppositely polarized sections are simply formed in this embodiment by the segments 1', 2 and 2'.

The operation of the piezo-electric transformer shown in FIG. 1 is as follows.

In case the terminals K1 and K2 are connected with the poles of an input voltage source, the input voltage present between terminals K1 and K2 is transformed into an output voltage that is present between terminal K2 and terminal K3. Because of the polarization of the different sections of the driving region and the arrangement of the segments, the 4 sections are effectively arranged in series between terminal K1 and terminal K2. The series arrangement of the sections is realized in a relatively simple way without making use of external conduction wires. Because of this series arrangement of the sections of the driving region the latter has a relatively high impedance. The piezo-electric transformer becomes very suitable for use with an input voltage having a relatively high amplitude when the output power is very low or zero.

Figure 2:
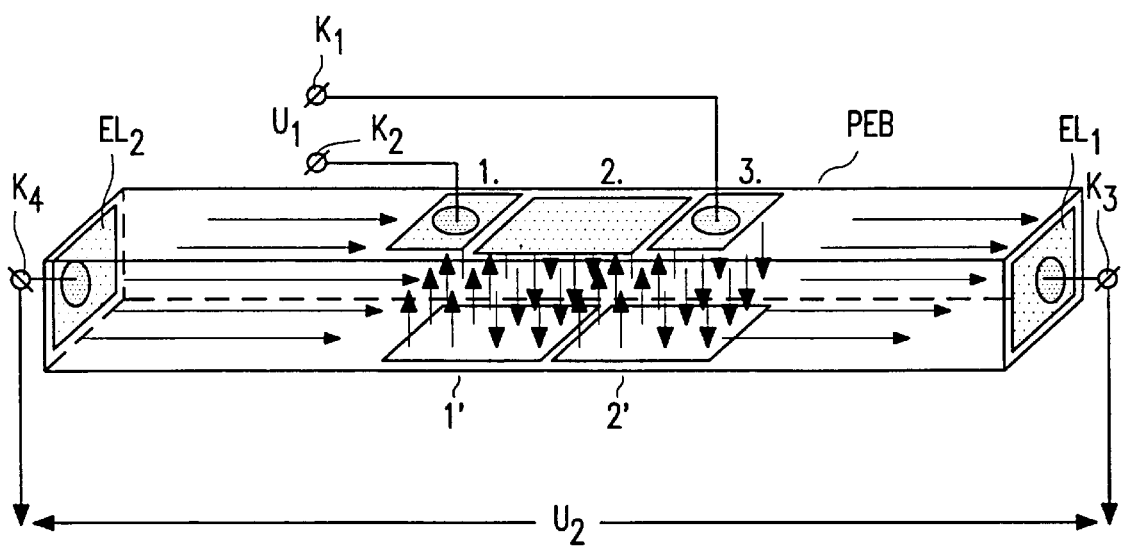
FIG. 2 shows a schematic representation of a further embodiment of a piezo-electric transformer according to the invention.

The embodiment of a piezo-electric transformer according to the invention shown in FIG. 2 is equipped with a second driven region. The piezo-electric body is a rectangular parallelepiped. When compared with the piezo-electric transformer shown in FIG. 1, the difference is the second driven region, being in contact with the first section of the driving region and extending in a direction opposite to the first driven region. The second driven region is of similar dimensions to those of the first driven region. Its polarization is in the same direction as the polarization of the first driven region. An end of the second driven region remote from the driving region is equipped with a second output electrode E12. The other parts of the embodiment shown in FIG. 2 are similar to parts shown in FIG. 1 and are labelled with the same symbols and numbers as are used in FIG. 1.

The operation of the piezo-electric transformer shown in FIG. 2 is very similar to the operation of the piezo-electric transformer shown in FIG. 1. An important difference with the operation of the piezo-electric transformer shown in FIG. 1 is that during operation the output voltage is present between terminal K3 and terminal K4, so that the output voltage and the input voltage have no common terminal. This means that the output voltage is DC-uncoupled from the input voltage. This can be very advantageous in some applications, for instance when the load of the piezo-electric transformer is a discharge lamp, as is the case in FIG. 4 described hereunder.

Figure 3:
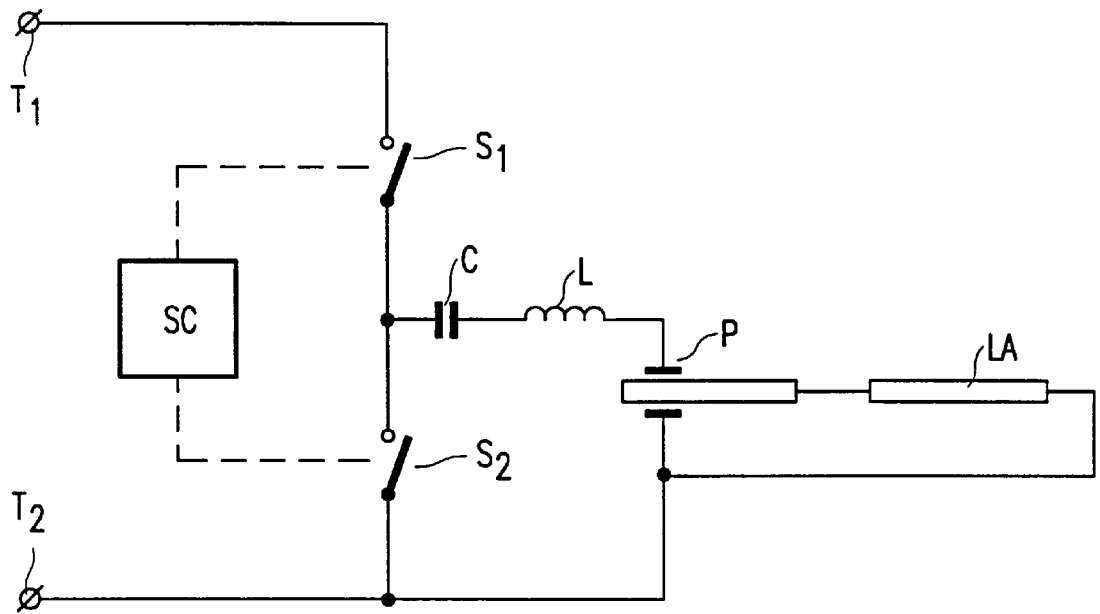
FIG. 3 shows a schematic representation of an embodiment of a circuit arrangement according to the invention for operating a discharge lamp comprising a piezo-electric transformer as shown in FIG. 1 together with a connected discharge lamp.

In FIG. 3 T1 and T2 are input terminals for connection to the poles of a DC voltage source. Input terminals T1 and T2 are connected by means of a series arrangement of switching elements S1 and S2. Control electrodes of switching elements S1 and S2 are coupled to respective output terminals of circuit part SC. This coupling is indicated in FIG. 3 by means of dotted lines. Circuitpart SC is a circuitpart for generating a high frequency signal for rendering switching elements S1 and S2 alternately conductive and nonconductive. A common terminal of switching element S1 and switching element S2 is connected to input terminal T2 by means of a series arrangement of capacitor C, coil L and the driving region of a piezo-electric transformer P as shown in FIG. 1. A discharge lamp La is connected between the output electrode of the driven region of the piezo-electric transformer and the input electrode of the driving region that is connected to input terminal T2.

The operation of the circuit arrangement shown in FIG. 3 is as follows.

In case input terminals T1 and T2 are connected to the poles of a DC-voltage source, switching elements S1 and S2 are rendered alternately conductive and non-conductive by a high frequency signal generated by circuitpart SC. As a result a high frequency current flows through capacitor C, coil L and the driving region of piezo-electric transformer P. As a result a high frequency voltage is present between the input terminals of the driving region and another high frequency voltage having the same frequency but an increased amplitude is present between the output terminal of the driven region and input terminal T2. This latter high frequency voltage is also present across the discharge lamp La. Immediately after the circuit arrangement has been switched on, the discharge lamp has not yet ignited and therefore the discharge lamp forms a very low load. After ignition of the discharge lamp La the discharge lamp carries a lamp current and therefore forms a much bigger load. It has been found that a circuit arrangement as shown in FIG. 1 which operates smoothly both during ignition and stationary operation of the discharge lamp can be made very compact and is relatively inexpensive.

Figure 4:
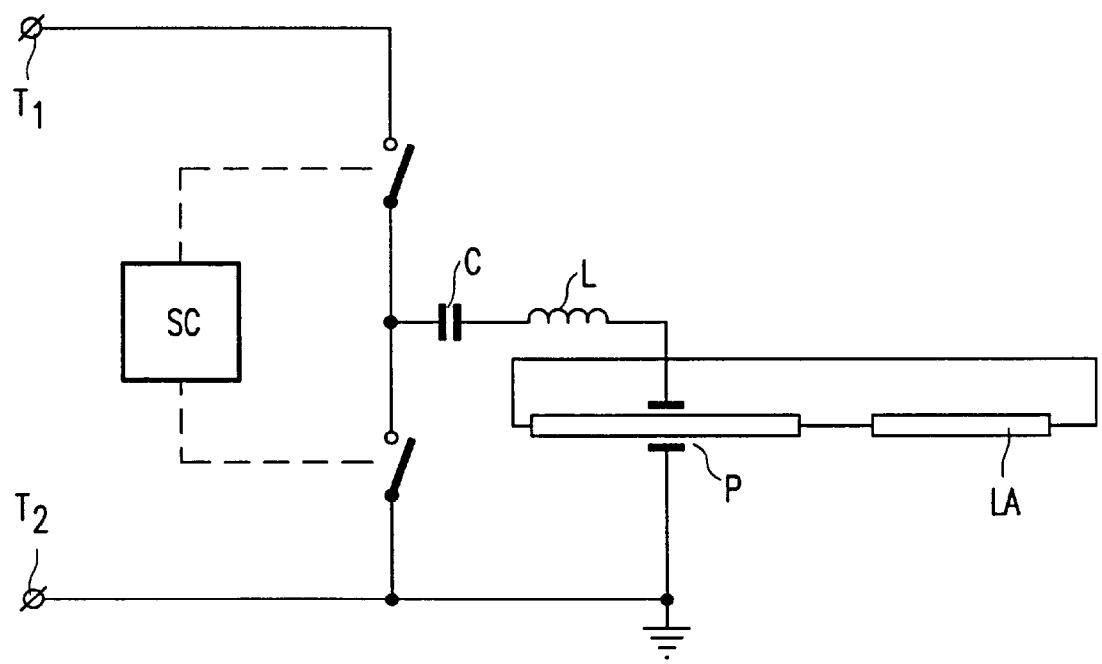
FIG. 4 shows a schematic representation of a further embodiment of a circuit arrangement according to the invention for operating a discharge lamp comprising a piezo-electric transformer as shown in FIG. 2 together with a connected discharge lamp.

The configuration of the major part of the embodiment of the circuit arrangement according to the invention shown in FIG. 4 is similar to that of the embodiment shown in FIG. 3. Corresponding components are indicated by means of the same reference symbols. The difference respect to the embodiment shown in FIG. 3 is that the piezo-electric transformer is one as shown in FIG. 2 comprising two driven regions. The discharge lamp La is connected between the output electrode of the first driven region and the output electrode of the second driven region. Input terminal T2 is connected to ground potential.

The operation of the circuit arrangement shown in FIG. 4 is very similar to the operation of that shown in FIG. 3 and will not separately be described here. The high frequency voltage that is present across the discharge lamp La during ignition and stationary operation is symmetrical with respect to ground potential. A general advantage of such a symmetrical lamp voltage is that it suppresses RFI. In the case where the discharge lamp is a low pressure mercury discharge lamp having a relatively long lamp vessel with a relatively thin diameter the symmetry of the lamp voltage also counteracts current leaking through parasitic capacitances.

Figure 5:
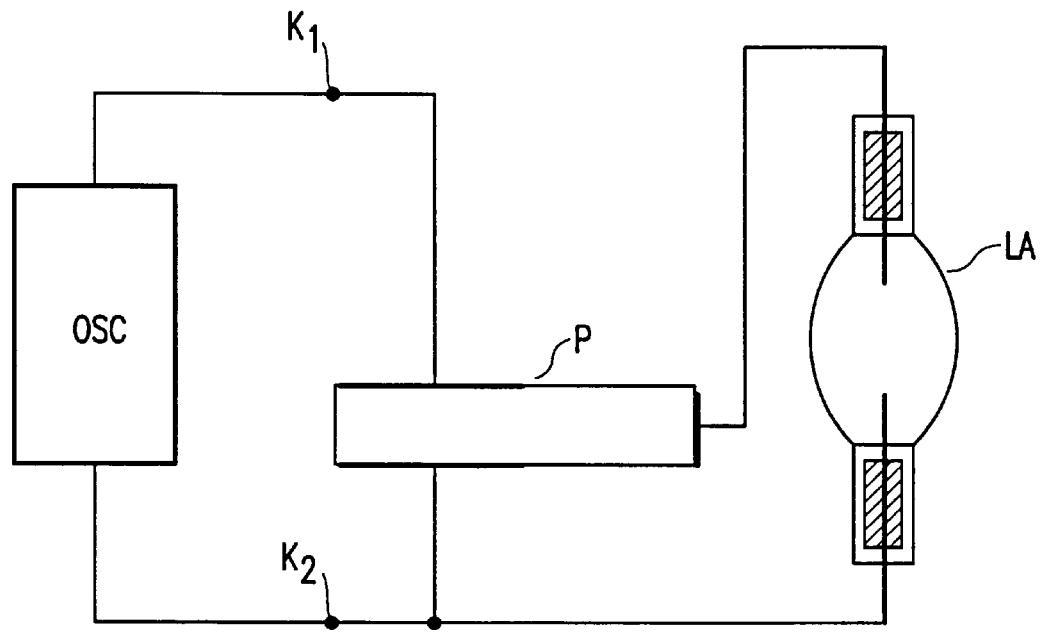
FIG. 5 and FIG. 6 show schematic representations of embodiments of circuit arrangements for igniting a high pressure discharge lamp with a high pressure discharge lamp connected to the circuit arrangement.

In FIG. 5 the input electrodes of a piezo-electric transformer P as shown in FIG. 1 are connected via terminals K1 and K2 to respective output terminals of an oscillator OSC. Oscillator OSC is a circuit part for generating a high frequency signal that is present between the output terminals. A high pressure discharge lamp La is connected between the output terminal of the driven region and the input electrode that is connected to terminal K2. During operation of the circuit arrangement shown in FIG. 5, oscillator OSC generates a high frequency signal that is present between the input electrodes of the piezo-electric transformer P. As a result a voltage with the same frequency but an increased amplitude is present between the output electrode and the input electrode that is connected to terminal K2 and therefore between the main electrodes of the high pressure discharge lamp La. The high pressure discharge lamp La is ignited by means of this voltage. After the high pressure discharge lamp La has ignited, a lamp current is immediately supplied to it by circuitry not shown in FIG. 5.

Figure 6:
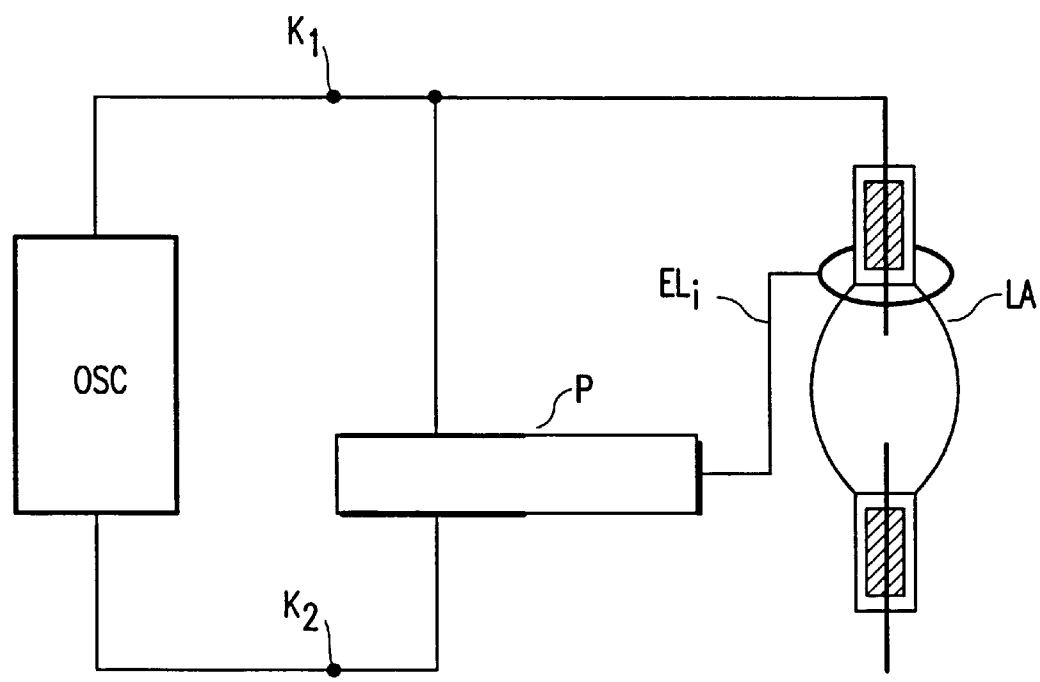

The circuit arrangement shown in FIG. 6 is very similar to the circuit arrangement shown in FIG. 5 and the same reference symbols are used to indicate similar components and circuit parts. In the configuration shown in FIG. 6 the output voltage generated by the piezo-electric transformer P is present between one of the main electrodes of the high pressure discharge lamp La and a special ignition electrode Eli that is connected outside the lamp vessel in the vicinity of one of the main electrodes. After the high pressure discharge lamp La has ignited, a lamp current is immediately supplied to it by circuitry not shown in FIG. 6.

We claim:

1. A piezo-electric transformer comprising: a piezo-electric body comprising a driving region having input electrode means and at least one driven region having output electrode means, said regions having opposite faces, at least one of the regions comprising a number of sections electrically polarized in a direction perpendicular to the opposite faces and with one pole of each section being connected to an opposite pole of another section by electrically conductive means in such a way that the sections form a series arrangement, characterized in that part of said sections are polarized in a first direction and the remainder of said sections are polarized in a second direction opposite to said first direction.

2. The piezo-electric transformer according to claim 1, wherein the driving region comprises the electrically polarized sections.

3. The piezo-electric transformer according to claim 2, wherein the driven region is polarized in a direction parallel to the opposite faces.

4. The piezo-electric transformer according to claim 1, wherein the driven region comprises the electrically polarized sections.

5. The piezo-electric transformer according to claim 1, wherein the piezo-electric body is a rectangular parallelepiped.

6. The piezo-electric transformer according to claim 1, wherein the electrically conductive means comprise a metallic coating.

7. The piezo-electric transformer according to claim 1, wherein the piezo-electric body comprises two driven regions, each having an output electrode means.

8. A circuit arrangement for operating a discharge lamp comprising: a piezo-electric transformer according to claim 1 having its input electrode means coupled to an alternating current source and its output electrode means coupled to the discharge lamp.

9. The piezo-electric transformer according to claim 1 wherein the number of sections electrically polarized perpendicular to said opposite faces comprise at least four such sections.

10. The circuit arrangement as claimed in claim 8 wherein the discharge lamp comprises a high pressure discharge lamp ignited via the piezo-electric transformer of claim 1.

11. The piezo-electric transformer according to claim 1 wherein the number of sections electrically polarized perpendicular to said opposite faces comprise at least three such sections.

12. The piezo-electric transformer according to claim 2 wherein the driven region comprises first and second sections each electrically polarized in a direction parallel to the opposite faces.

13. The piezo-electric transformer according to claim 1 comprising at least first and second separate conductive coating segments on one opposite face overlying at least a part of said driving region and third and fourth separate conductive coating segments on another opposite face and overlying at least a part of said driving region, wherein said at least first, second, third and fourth conductive coating segments form said input electrode means and said electrically conductive means.

14. The piezo-electric transformer according to claim 2 wherein said electrically conductive means comprises first and second electrodes of the input electrode means secured to one opposite face and dimensioned so as to provide a desired value of input impedance of the piezo-electric transformer.

15. The piezo-electric transformer according to claim 2 wherein said input electrode means comprises first and second electrode segments on one opposite face and coupled directly to first and second respective terminals of a source of alternating current.

16. A circuit for operating a discharge lamp comprising:

a piezo-electric transformer according to claim 1, first and second controlled switching devices coupled in series to first and second terminals of a supply voltage source, an inductor and a capacitor serially connected between a terminal of the input electrode means of the piezo-electric transformer and a common junction between said first and second switching devices, and said output electrode means are coupled to the discharge lamp.

17. The circuit according to claim 16 wherein the driven region comprises two electrically polarized sections and respective terminals of the discharge lamp are coupled to respective ones of the two sections via the output electrode means, said driving region being arranged in the piezo-electric body intermediate the two electrically polarized sections.

* * * * *